(12) United States Patent
Jin et al.

(10) Patent No.: US 8,830,011 B2
(45) Date of Patent: Sep. 9, 2014

(54) BAND-PASS FILTER USING LC RESONATORS

(75) Inventors: Jun-De Jin, Hsinchu (TW); Tzu-Jin Yeh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 379 days.

(21) Appl. No.: 13/282,642

(22) Filed: Oct. 27, 2011

(65) Prior Publication Data
US 2013/0106532 A1    May 2, 2013

(51) Int. Cl.
*H03H 7/075* (2006.01)
*H03H 7/01* (2006.01)

(52) U.S. Cl.
CPC ............. *H03H 7/075* (2013.01); *H03H 7/1758* (2013.01)
USPC ............ 333/168; 333/175; 333/176; 333/172

(58) Field of Classification Search
USPC .................................. 333/168, 167, 176, 177
See application file for complete search history.

(56) References Cited

U.S. PATENT DOCUMENTS

| | | | |
|---|---|---|---|
| 2002/0014931 A1* | 2/2002 | Tsukamoto et al. | 333/134 |
| 2009/0153270 A1* | 6/2009 | Beerwerth | 333/202 |
| 2010/0060380 A1* | 3/2010 | Tsuzuki et al. | 333/168 |

OTHER PUBLICATIONS

Hong, J.S. et al., Microstrip fiiters for RF/Microwave applications, 2001, John Wiley and Sons, p. 59.
Yeung, L.K. et al., Low-temperature cofied ceramic LC filters for RF applications, IEEE Microwave Magazine, Oct. 2008, pp. 118-128.
Sutono, A. et al., "Development of integrated three dimensional bluetooth image reject filter", IEEE IMS, Jun. 2000, pp. 339-342.
Yeung, L.K. et al.,, "A compact second-order LTCC bandpass filter with two finite transmission zeros", IEEE on Microwave Theory and Techniques, Feb. 2003, 51(2):337-341.

* cited by examiner

*Primary Examiner* — Stephen Jones
*Assistant Examiner* — Scott S Outten
(74) *Attorney, Agent, or Firm* — Duane Morris LLP

(57) ABSTRACT

A band-pass filter includes an input node coupled to receive an oscillating input signal, an output node, and a first LC resonator coupled to a first node coupled between the input node and the output node and to a first power supply node coupled to provide a first voltage. The first LC resonator includes a first capacitor, and a first inductor coupled in series with the first capacitor. The output node is coupled to output a filtered response signal that includes at least one zero based on the oscillating input signal and the first LC resonator.

15 Claims, 6 Drawing Sheets

BAND-PASS FILTER USING LC RESONATORS

FIELD OF DISCLOSURE

The disclosed system and method relate to integrated circuits. More specifically, the disclosed system and method relate to filters that may be implemented in integrated circuits.

BACKGROUND

Communication circuits typically include one or more filters such that the signal of interest may be extracted from other received signals. One example of a filter is a band-pass filter ("BPF"). BPFs are configured to pass signals having frequencies within a certain band and block frequencies above and below the band. However, conventional BPFs suffer from requiring a large number of devices to provide a minimal number of zeroes.

DETAILED DESCRIPTION

This description of the exemplary embodiments is intended to be read in connection with the accompanying drawings, which are to be considered part of the entire written description.

Figure 1:
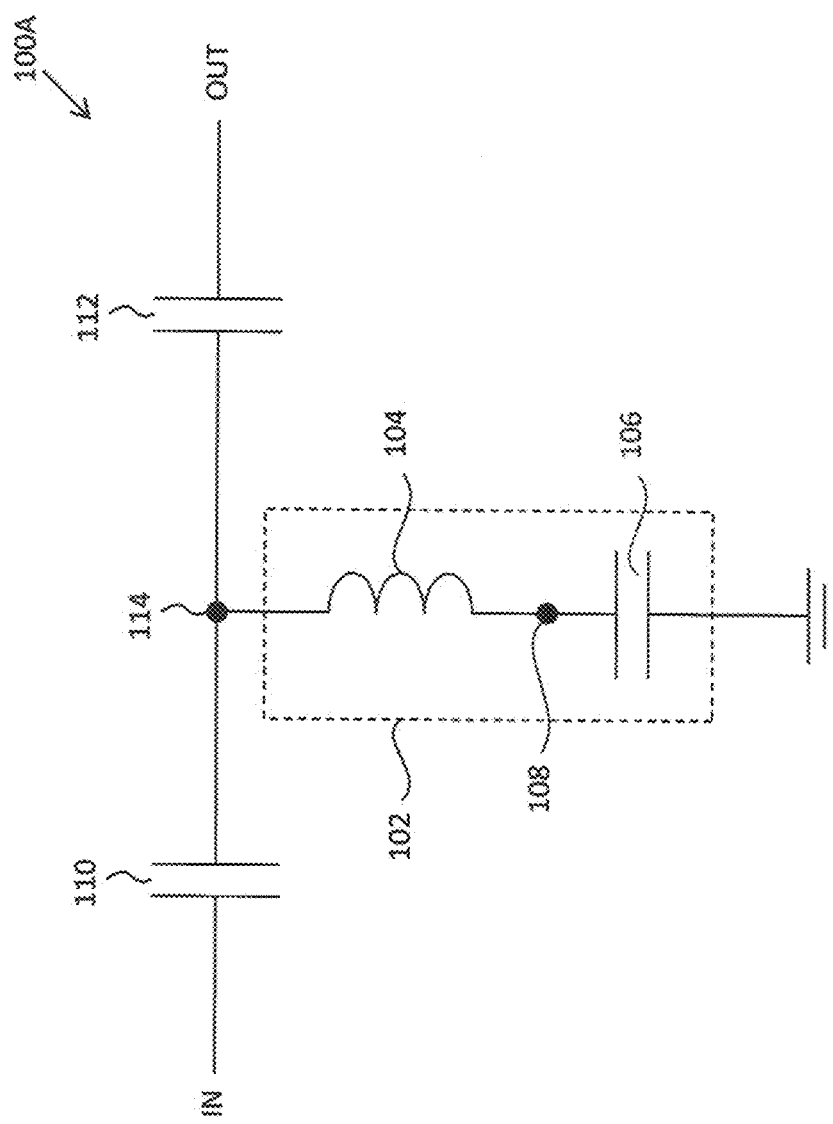
FIG. 1 illustrates one example of an improved band-pass filter comprising a single series LC resonator configured to provide a zero in the output response of the filter.

Improved band-pass filters ("BPFs") are disclosed in which inductors and capacitors are coupled in series to provide series inductor/capacitor ("LC") resonators that improve the response of the BPFs. FIG. 1 illustrates one example of a BPF, generically 100, configured to provide a response at the output node, OUT, that includes a single zero in response to receiving an oscillating, e.g., a radio frequency ("RF") or other non-constant or periodic, input signal at the input node, IN. One skilled in the art will understand that the input signal may include a plurality of signals of differing frequencies.

As shown in FIG. 1, BPF 100A includes a series LC resonator 102 comprising an inductor 104 coupled in series with a capacitor 106 at node 108. LC resonator 102 is coupled in parallel with matching capacitors 110 and 112, which are connected in series between input node, IN, and output node, OUT. In particular, inductor 104 is shown as being coupled to node 114, which is coupled between capacitor 110 and capacitor 112. One skilled in the art will understand that the capacitor 106 may be disposed between nodes 114 and 108 and inductor 104 may be disposed between node 108 and a voltage supply node or rail, such as ground. BPF 100A illustrated in FIG. 1 advantageously provides a zero using only four passive components and may be configured to provide the zero at a desired frequency by adjusting the sizes of inductor 104 and capacitor 106 as will be understood by one skilled in the art. The sizes of matching capacitors 110 and 112 are selected to provide impedance matching between a circuit coupled to input node IN and a circuit coupled to output node OUT as will be understood by one skilled in the art.

Figure 2:
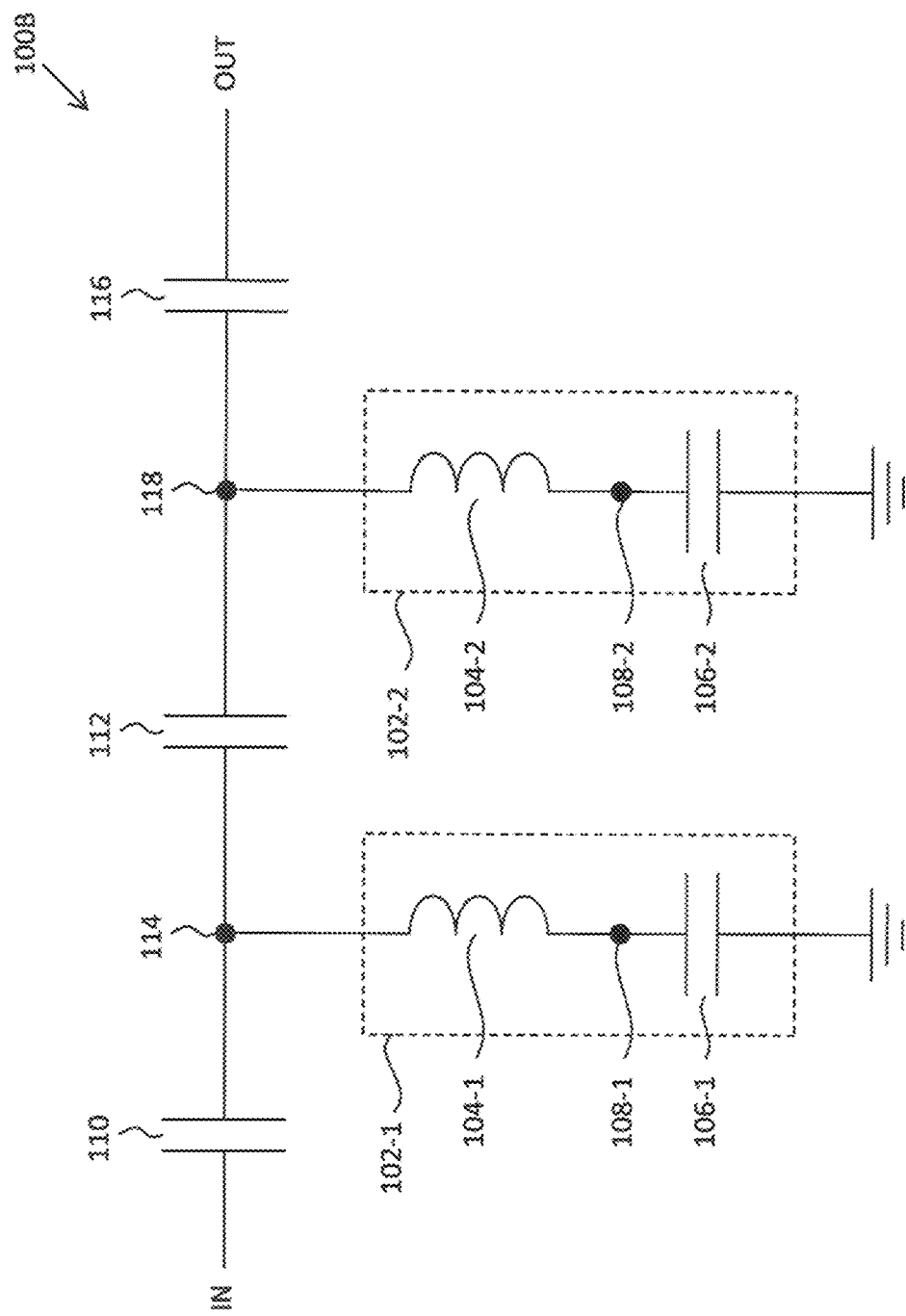
FIG. 2 illustrates another example of an improved band-pass filter comprising a single series LC resonator configured to provide a zero in the output response of the filter.

BPFs that generate additional zeroes to further improve stop-band attenuation may be created by increasing the number of series LC resonators. For example, FIG. 2 illustrates another embodiment of a BPF 100B that includes a pair of series LC resonators 102-1 and 102-2 (collectively referred to as "series LC resonators 102") disposed in parallel with each other. As shown in FIG. 2, series LC resonator 102-1 includes inductor 104-1 coupled in series with capacitor 106-1, which is also coupled to ground, at node 108-1. Inductor 104-1 is also coupled to node 114, which is disposed between impedance matching capacitors 110 and 112.

Series LC resonator 102-2 is coupled to node 118 disposed between impedance matching capacitors 112 and 116. Like LC resonator 102-1, LC resonator 102-2 includes a capacitor 106-2, which is coupled to ground and to inductor 104-2 at node 108-2. Capacitor 116 is coupled to output node, OUT. The BPF 100B illustrated in FIG. 2 advantageously provides two zeroes when the LC value of series LC resonators 102-1 and 102-2 are different from one another.

Figure 3:
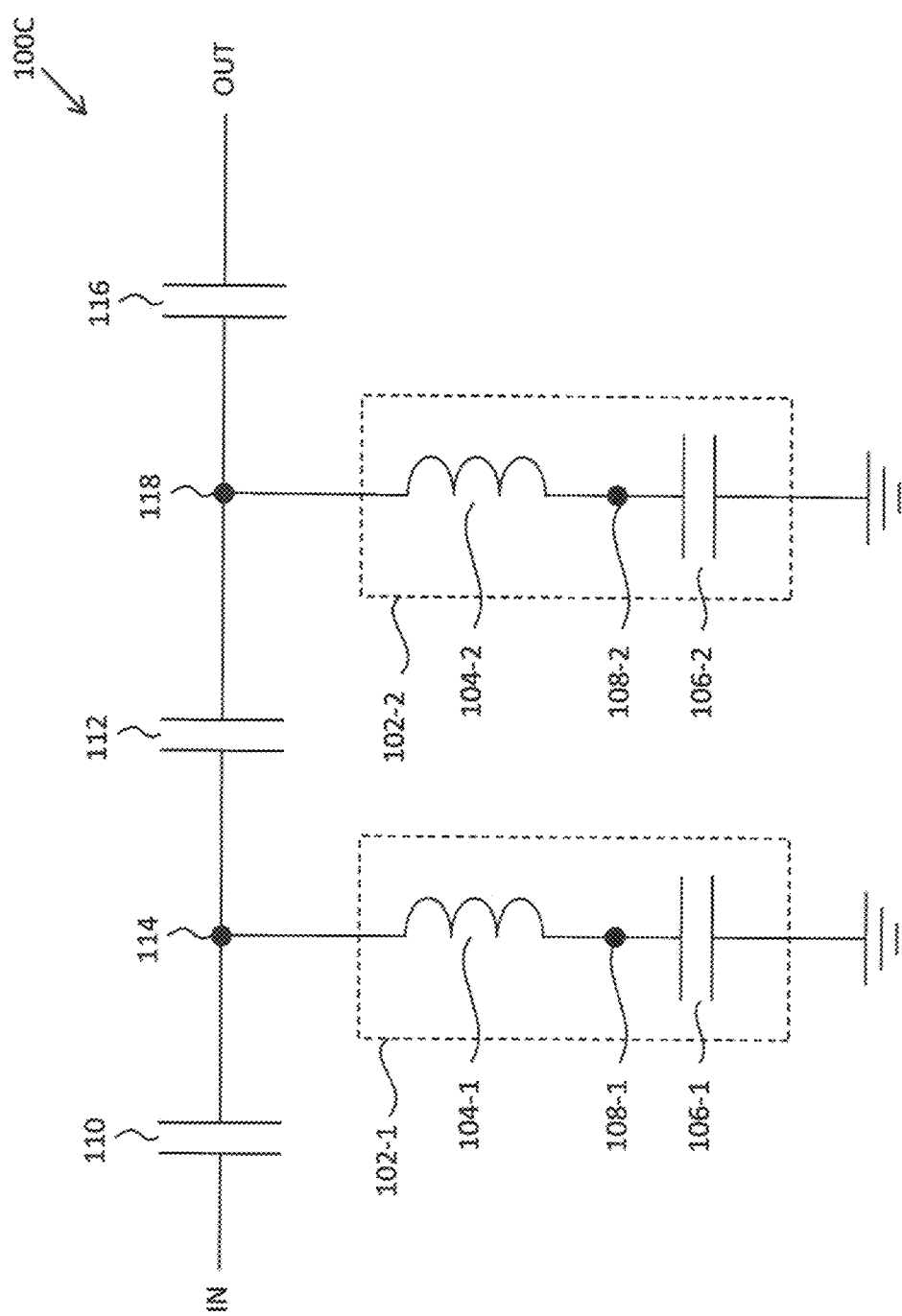
FIG. 3 illustrates an example of an improved band-pass filter comprising two series LC resonators each configured to provide a respective zero in the output response of the filter.

In some embodiments, such as the BPF 100C illustrated in FIG. 3, impedance matching capacitors 110 and 116 may be omitted such that node 114 serves as the input node, IN, and node 118 serves as the output node, OUT. Accordingly, implementing a pair of series LC resonators 102 enables two zeroes to be generated using as few as five components.

Figure 4:
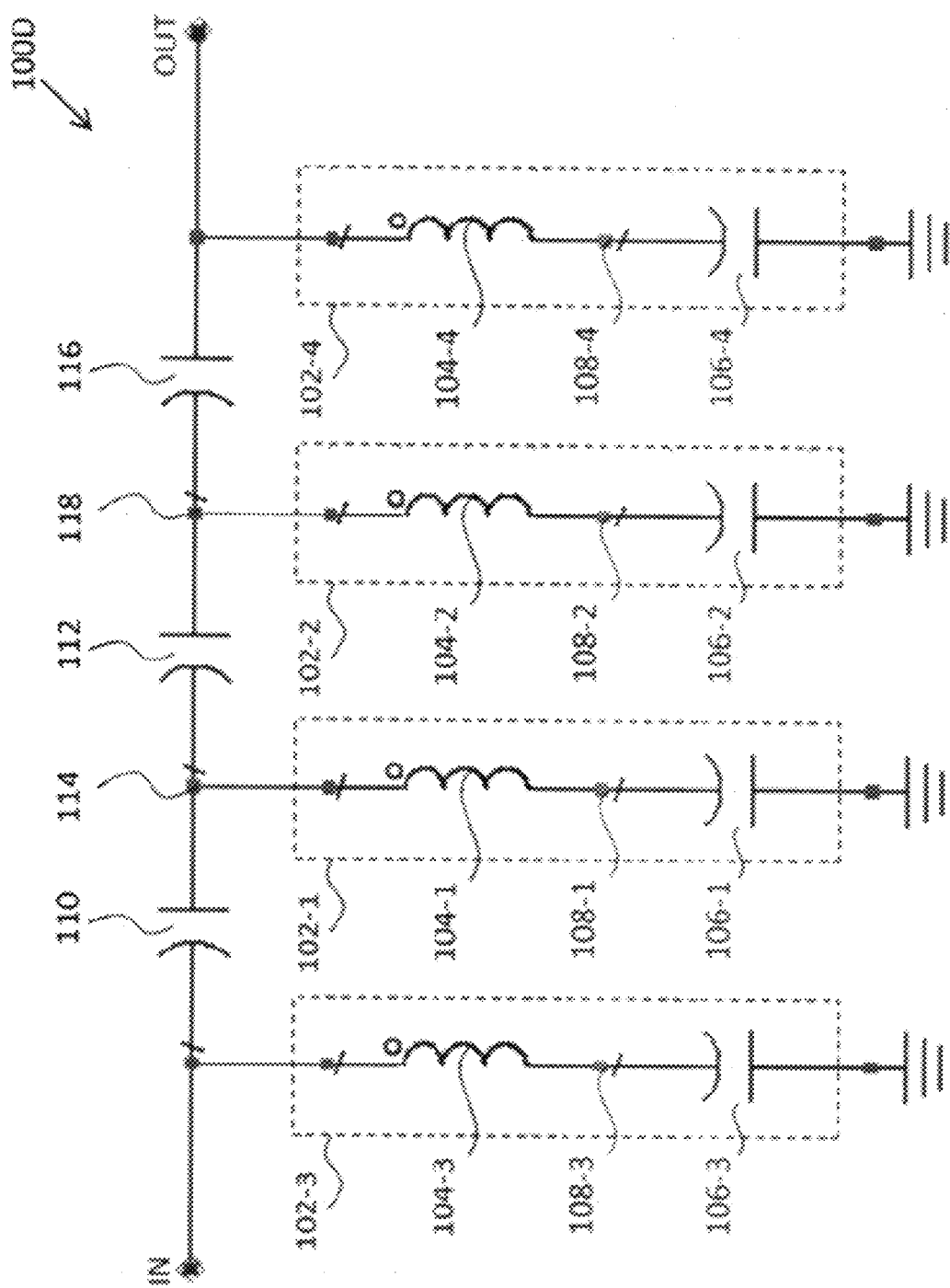
FIG. 4 illustrates an example of an improved band-pass filter comprising four series LC resonators each configured to provide a respective zero in the output response of the filter.

Another example of an improved BPF 100D is illustrated in FIG. 4. As shown in FIG. 4, BPF 100D includes a plurality of series LC resonators 102-1, 102-2, 102-3, and 102-4 (collectively referred to as "LC resonators 102") disposed and coupled in parallel with each other. Each series LC resonator 102 includes an inductor 104 coupled in series with a capacitor 106 at a node 108. Capacitors 110, 112, and 116 are disposed in parallel with series LC resonators 102.

For example, capacitor 110 is disposed between input node, IN, to which series LC resonator 102-3 is coupled and to node 114 to which series LC resonator 102-1 is coupled. Node 118 is disposed between capacitors 112 and 116 and is coupled to series LC resonator 102-2. Series LC resonator 102-4 is coupled to output node, OUT. Capacitors 110, 112, and 116 are configured to providing matching between the input node, IN and output node, OUT. Each of the series LC resonators 102 is configured to provide a zero in the output of BPF 100D when the LC values of each LC resonator 102 are different.

Figure 5:
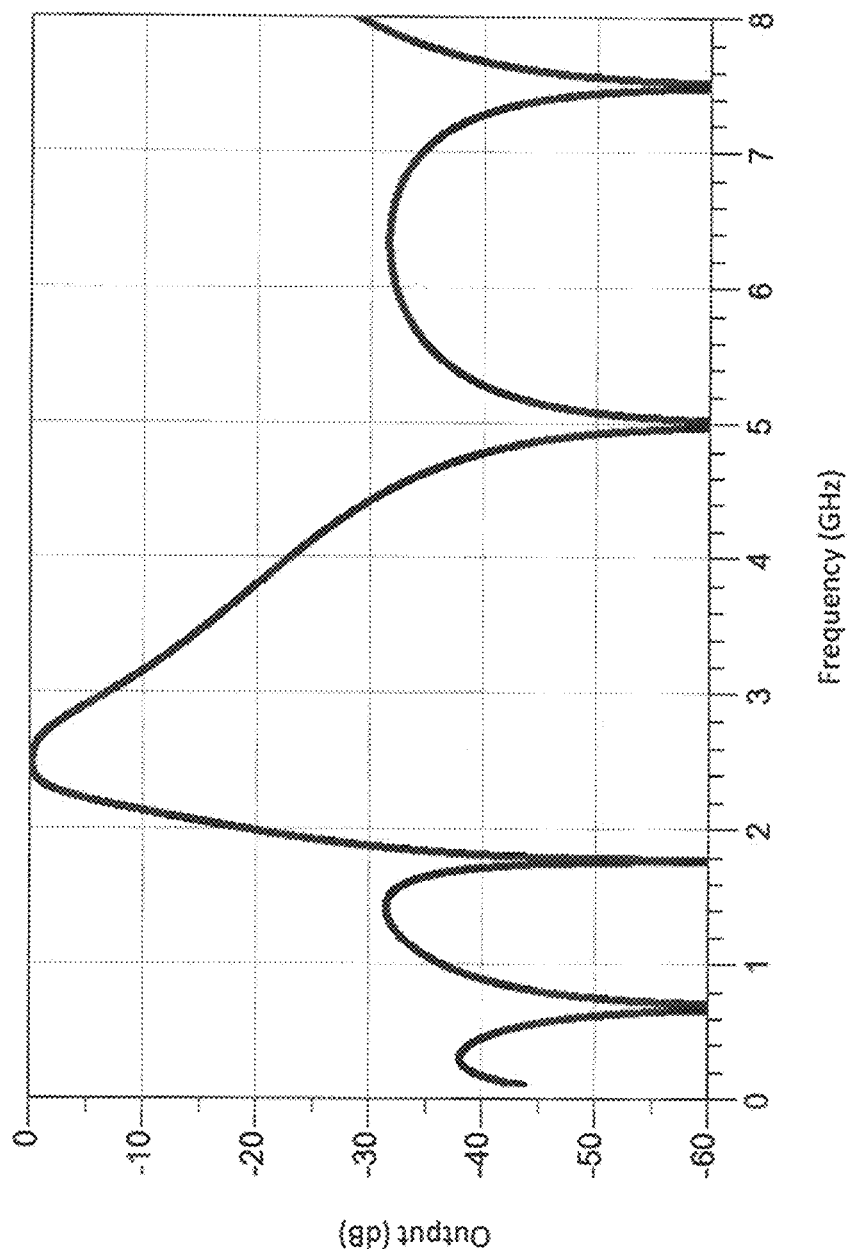
FIG. 5 is a simulation of the output response of an improved band-pass filter in accordance with the embodiment illustrated in FIG. 4.

FIG. 5 illustrates one example of a response of a BPF in accordance with the embodiment illustrated in FIG. 4. As shown in FIG. 5, the response of the BPF provides four zeroes: one at approximately 0.75 GHz, another at approximately 1.8 GHz, another at approximately 5 GHz, and another at approximately 7.5 GHz. The simulation of illustrated in FIG. 5 was generated using the following device sizes:

| Device | Size |
| --- | --- |
| Inductor 104-1 | 1.7 nH |
| Inductor 104-2 | 3.4 nH |
| Inductor 104-3 | 0.51 nH |
| Inductor 104-4 | 0.19 nH |
| Capacitor 106-1 | 27 pF |
| Capacitor 106-2 | 2.3 pF |
| Capacitor 106-3 | 2 pF |
| Capacitor 106-4 | 2.3 pF |
| Capacitor 110 | 7 pF |
| Capacitor 112 | 0.8 pF |
| Capacitor 116 | 7 pF |

In addition to adjusting the numbers of zeroes in the output of a BPF by increasing the number of series LC resonators 102 as described above, the placement and sizing of the devices that form the series LC resonators 102 may be configured to adjust the output response of a BPF. For example, by identically sizing the devices of different series LC resonators 102 results in the two series LC resonators 102 to provide the same zero enables a higher production yield to be achieved with less design effort. Placing inductors 104 of different series LC resonators 102 in close proximity to one another on a semiconductor substrate (not shown) such that inductors 104 are inductively coupled together also adjusts the output response of the BPF.

For example and referring to FIG. 2, assume series LC resonators 102-1 and 102-2 are sized the same and are disposed at a distance from one another such that the mutual inductive coupling between them is negligible. In some embodiments, negligible coupling includes values of 0.1 and less. In this configuration, the output response of BPF 100B will provides a single zero, which may be at 1 GHz. Changing the layout of BPF 100B such that inductors 102-1 and 102-2 of series LC resonators 102 are mutually inductively coupled together may result in the output response of BPF 100B such that two zeroes are provided on either side of the original 1 GHz. For example, one zero may be located at 1.1 GHz and another zero may be located at 0.9 GHz. One skilled in the art will understand that various combinations are possible.

Figure 6:
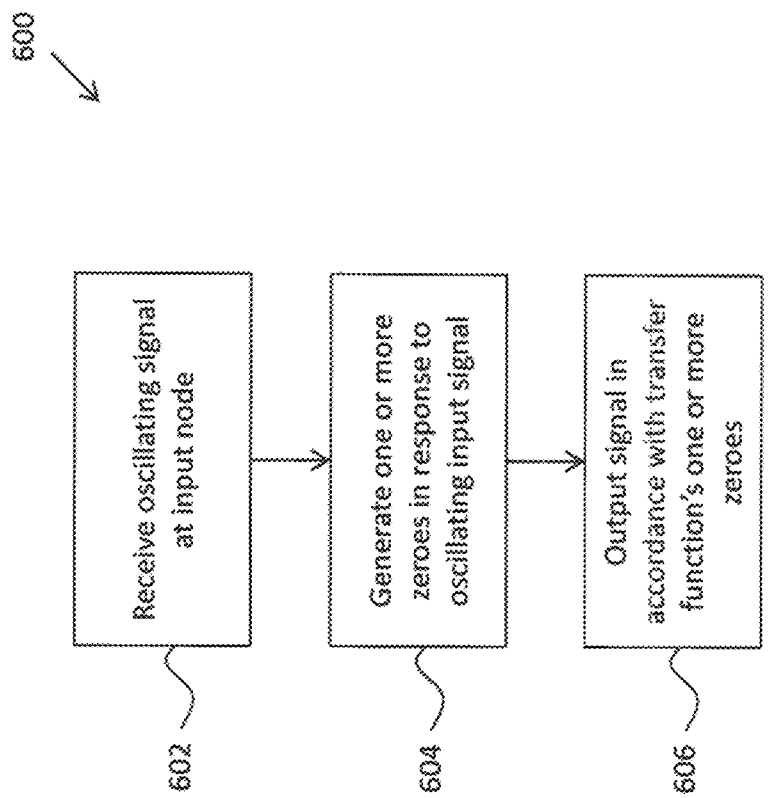
FIG. 6 is a flow diagram of one example of a method of filtering a signal by a band-pass filter in accordance with the band-pass filter illustrated in FIG. 4.

The operation of BPF 100D is described with reference to FIG. 6, which is a flow diagram of one example of a method 600 of filtering a signal. At block 602, an oscillating signal is received at input node IN. As described above, the oscillating signal may be a periodic signal having a certain frequency such as an RF, microwave, or other signal.

At block 604, the input signal is filtered by the BPF in accordance with the transfer function of the BPF. The transfer function of the BPF may include one or more zeroes depending on the number of series LC resonators 102 that the BPF includes. For example, BPF 100D includes four series LC resonators and may be generated up to four different zeroes. In some embodiments, the transfer function of BPF 100D may include fewer than four zeroes depending on the relative placement of and coupling between the series LC resonators. As described above and referring to FIG. 4, the transfer function of BPF 100D may include two zeroes if series LC resonators 102-3 and 102-1 are positioned close to one another such that the coupling between LC resonators 102-3 and 102-1 is negligible, e.g., less than or equal to 0.1, and if series LC resonators 102-2 and 102-4 are also positioned close to one another such that the coupling between LC resonators 102-3 and 102-1 is negligible.

At block 606, the filtered signal is output from output node OUT. As will be understood by one skilled in the art, the signal output from the BPF is based on the oscillating input signal and the transfer function of the BPF. For example and as illustrated in FIG. 5, BPF 100D may output frequencies between 1.8 GHz and 5 GHz while blocking frequencies outside of the pass-band. The zeroes generated by the BPF advantageously provide higher stop-band attenuation compared to BPFs that do not include one or more zeroes in its transfer function.

In some embodiments, a band-pass filter includes an input node coupled to receive an oscillating input signal, an output node, and a first LC resonator coupled to a first node coupled between the input node and the output node and to a first power supply node coupled to provide a first voltage. The first LC resonator includes a first capacitor, and a first inductor coupled in series with the first capacitor. The output node is coupled to output a filtered response signal that includes at least one zero based on the oscillating input signal and the first LC resonator.

In some embodiments, a band-pass filter includes an input node configured to receive an oscillating input signal, an output node, a first LC resonator, and a first LC resonator coupled to a first node coupled between the input node and the output node and to a first power supply configured to provide a first voltage. The first LC resonator includes a first capacitor and a first inductor coupled in series with the first capacitor. A second capacitor is coupled between the input node and the first node, and a third capacitor is coupled between the first node and the output node. The output node is configured to output a filtered response signal that includes at least one zero based on the oscillating input signal and the first LC resonator.

In some embodiments, a band-pass filter includes an input node coupled to receive an oscillating input signal, an output node, and a plurality of LC resonators disposed in parallel with each other. Each of the plurality of LC resonators is coupled to a respective node disposed between the input node and the output node. Each of the LC resonators includes an inductor and a capacitor disposed in series with the inductor. The output node is coupled to output a filtered response signal that includes at least one zero based on the oscillating input signal and the plurality of LC resonators.

In some embodiments, a method includes receiving an input signal at an input node of a band-pass filter, filtering the input signal to provide an output signal in accordance with a transfer function of the band-pass filter, and outputting the output signal from an output node. The band-pass filter includes a first LC resonator coupled to a first node coupled between the input node and an output node and to a first power supply node coupled to provide a first voltage. The first LC resonator includes a first capacitor and a first inductor coupled in series with the first capacitor. The transfer function of the band-pass filter includes at least one zero provided by the first LC resonator.

The improved BPFs described herein advantageously have output responses that include one or more zeroes using a small number of passive components. Implementing a BPF that generates one or more zeroes with a limited number of components provides high stop-band attenuation with a small circuit footprint.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A band-pass filter, comprising:
an input node coupled to receive an oscillating input signal;
an output node;

a first LC resonator coupled to a first node coupled between the input node and the output node and to a first power supply node coupled to provide a first voltage, the first LC resonator including:
  a first capacitor, and
  a first inductor coupled in series with the first capacitor,
a second LC resonator coupled in parallel with the first LC resonator and coupled to a second node coupled between the input node and the output node, the second LC resonator including:
  a second capacitor, and
  a second inductor disposed in series with the second capacitor;
wherein the output node is coupled to output a filtered response signal that includes at least one zero based on the oscillating input signal and the first LC resonator, and
wherein the first and second inductors are disposed at a distance from one another on a semiconductor substrate such that the first and second inductors are inductively coupled together.

2. The band-pass filter of claim 1, further comprising:
a plurality of LC resonators respectively coupled to a node that is coupled between the input node and the output node, each of the plurality of LC resonators disposed in parallel with each other and with the first LC resonator.

3. The band-pass filter of claim 2, further comprising at least one capacitor coupled between each of the nodes to which the LC resonators are coupled.

4. The band-pass filter of claim 1, wherein an inductor/capacitor (LC) value of the first LC resonator is equal to an LC value of the second LC resonator such that the output response of the band-pass filter provides a single zero.

5. The band-pass filter of claim 1, wherein an inductor/capacitor (LC) value of the first LC resonator is equal to an LC value of the second LC resonator and the output response of the band-pass filter provides at least two zeroes.

6. The band-pass filter of claim 1, further comprising a third capacitor coupled between the first and second nodes.

7. The band-pass filter of claim 1, further comprising:
a third capacitor coupled between the input node and the first node, and
a fourth capacitor coupled between the first node and the output node.

8. A band-pass filter, comprising:
an input node configured to receive an oscillating input signal;
an output node; and
a first LC resonator coupled to a first node coupled between the input node and the output node and to a first power supply configured to provide a first voltage, the first LC resonator including:
  a first capacitor, and
  a first inductor coupled in series with the first capacitor;
a second capacitor coupled between the input node and the first node;
a third capacitor coupled between the first node and the output node; and
a second LC resonator coupled in parallel with the first LC resonator and coupled to a second node coupled between the third capacitor and a fourth capacitor that is coupled to the output node, the second LC resonator including:
  a fifth capacitor, and
  a second inductor disposed in series with the fifth capacitor,
wherein the output node is configured to output a filtered response signal that includes at least one zero based on the oscillating input signal and the first LC resonator, and
wherein the first and second inductors are disposed at a distance from one another on a semiconductor substrate such that the first and second inductors are inductively coupled together.

9. The band-pass filter of claim 8, further comprising:
a plurality of LC resonators respectively coupled to a node coupled between the input node and the output node, each of the plurality of LC resonators disposed in parallel with each other and with the first LC resonator.

10. The band-pass filter of claim 9, further comprising at least one capacitor coupled between each of the nodes to which the LC resonators are coupled.

11. The band-pass filter of claim 8, wherein an inductor/capacitor (LC) value of the first LC resonator is equal to an LC value of the second LC resonator such that the output response of the band-pass filter provides a single zero.

12. The band-pass filter of claim 8, wherein an inductor/capacitor (LC) value of the first LC resonator is equal to an LC value of the second LC resonator and the output response of the band-pass filter provides at least two zeroes.

13. A method, comprising:
receiving an input signal at an input node of a band-pass filter formed on a semiconductor substrate, the band-pass filter comprising:
  a first LC resonator coupled to a first node coupled between the input node and an output node and to a first power supply node coupled to provide a first voltage, the first LC resonator including:
    a first capacitor, and
    a first inductor coupled in series with the first capacitor; and
  a second LC resonator coupled in parallel with the first LC resonator and coupled to a second node coupled between the input node and the output node, the second LC resonator including:
    a second capacitor, and
    a second inductor disposed in series with the second capacitor and positioned on the semiconductor substrate such that the second inductor is inductively coupled to the first inductor;
filtering the input signal to provide an output signal in accordance with a transfer function of the band-pass filter, the transfer function including at least one zero provided by the first LC resonator; and
outputting the output signal from the output node.

14. The band-pass filter of claim 13, wherein the transfer function of the band-pass filter includes a first zero that corresponds to the first LC resonator and a second zero that corresponds to the second LC resonator.

15. The band-pass filter of claim 13, wherein the transfer function of the band-pass filter includes a single zero that corresponds to a combination of the first and second LC resonators.

* * * * *